United States Patent [19]

Burd et al.

[11] 4,201,746
[45] * May 6, 1980

[54] APPARATUS FOR ZONE REFINING

[75] Inventors: John W. Burd, Chesterfield; Bobbie D. Stone, Ballwin; William F. Tucker, Chesterfield; Kedar P. Gupta, Creve Coeur, all of Mo.

[73] Assignee: Monsanto Company, St. Louis, Mo.

[ * ] Notice: The portion of the term of this patent subsequent to Aug. 30, 1994, has been disclaimed.

[21] Appl. No.: 806,139

[22] Filed: Jun. 13, 1977

Related U.S. Application Data

[63] Continuation-in-part of Ser. No. 754,155, Dec. 27, 1976, Pat. No. 4,045,181.

[51] Int. Cl.² .............................................. B01J 17/10
[52] U.S. Cl. .................................... 422/250; 156/620;
156/DIG. 93; 285/9 M; 285/11; 403/DIG. 1
[58] Field of Search ....................... 156/620; 23/273 Z;
285/9 M, 10, 11; 403/DIG. 1

[56] References Cited

U.S. PATENT DOCUMENTS

| | | | |
|---|---|---|---|
| 2,557,140 | 6/1951 | Razdowitz | 285/9 M |
| 3,151,695 | 10/1964 | Mintz | 285/9 M |
| 3,240,341 | 3/1966 | Rosden | 285/9 M |
| 3,275,417 | 9/1966 | Hunt | 156/620 |
| 3,558,281 | 1/1971 | Dyer | 156/620 |
| 4,045,181 | 8/1977 | Burd | 156/620 |
| 4,045,183 | 8/1977 | Barowski | 156/620 |

FOREIGN PATENT DOCUMENTS 146090 of 1960 U.S.S.R. .................................. 156/620

OTHER PUBLICATIONS

Keck et al., Rev. of Sci. Instru., vol. 25, #4, Apr. 1954, pp. 331-334.

Primary Examiner—Stephen J. Emery
Attorney, Agent, or Firm—Henry Croskell

[57] ABSTRACT

Improvements in apparatus for zone refining polycrystalline semiconductor rods to produce monocrystalline semiconductor rods are disclosed. In the apparatus, an inductive heating chamber is employed which has a longitudinal dimension independent of the length of the polycrystalline semiconductor rod to be processed. The longitudinal dimension of the induction heating chamber is limited only by considerations of the space required for the RF induction heating coil and related apparatus which must be mounted within the chamber, the viewing space required for the operator to observe the zone refining process, and the heating effect on the structures above and below the chamber. First and second gas tight bellows are provided which, respectively, surround the rod holder and the seed holder. One end of each of the first and second bellows is releasably and sealingly attached to the induction heating chamber, while the other end of each of the first and second bellows is attached to the base of the rod holder or seed holder, respectively. The base of the rod holder or seed holder incorporates a gas tight magnetic fluid seal means for providing dynamic sealant between the chamber and drive means. These bellows expand and collapse with the relative movement of the rod holder and seed holder with respect to the induction heating chamber. Moreover, with the rod holder displaced from the induction heating chamber, the first bellows may be detached from the chamber and collapsed to facilitate mounting a polycrystalline semiconductor rod to be refined in the rod holder, and when the refining process is complete and the seed holder is displaced from the chamber, the second bellows can be detached from the chamber and collapsed to facilitate the removal of the refined monocrystalline rod from the seedholder. In order to protect the lowermost bellows from molten semiconductor, a plurality of telescoping metallic cylinders are positioned within the bellows and concentric therewith.

7 Claims, 5 Drawing Figures

APPARATUS FOR ZONE REFINING

CROSS-REFERENCE TO RELATED APPLICATION

This application is a continuation-in-part of co-assigned application Ser. No. 754,155 of John W. Burd, et al, filed Dec. 27, 1976, now U.S. Pat. No. 4,045,181, issued Aug. 30, 1977.

BACKGROUND OF THE INVENTION

The present invention generally relates to apparatus for zone refining polycrystalline semiconductor rods to produce monocrystalline semiconductor rods, and more particularly to improvements in said apparatus which permit the processing of larger diameter rods, and longer rods, without unduly increasing the overall height of the apparatus.

Conventional apparatus for zone refining includes an induction heating chamber. A rod holder for holding a polycrystalline semiconductor rod to be refined comes into the chamber from the top. A seed holder for holding a semiconductor seed crystal comes into the chamber from the bottom. The chamber has a door with a window, the window being necessary to permit the operator to watch the zone refining operation especially during the initial stage when the seed crystal is fused to the molten end of the semiconductor rod.

In a typical apparatus, a polycrystalline semiconductor rod on the order of 110 cm long can be refined. Such a rod is attached to the rod holder at its upper end, and a 6 mm diameter seed crystal is attached to the seed holder. A heavy RF induction heating coil of suitable design is positioned near the middle of the induction heating chamber. The chamber is purged and then either evacuated or filled with an inert gas, such as argon. The rod holder and rod are moved down so that the free end of the rod approaches the RF induction heating coil. The RF coil inductively heats and melts the bottom or free end of the semiconductor rod until a good molten droplet of semiconductor is formed. At that point, the seed crystal and seed holder moves up to the molten end of the rod within the heating zone of the RF coil. The seed crystal fuses and is pulled away to create a taper at the molten end of the semiconductor rod. Thereafter, the zone of the melt is moved up the rod by moving both the rod and the seed crystal downward. Relative movement between the seed holder and rod holder controls the diameter of the refined monocrystalline semiconductor rod and, in addition, the rod holder and seed holder can be independently rotated as both move downwardly with respect to the induction heating chamber.

In order to melt the semiconductor rod, the RF power required is substantial, and losses are minimized by providing the tank circuit just outside the induction heating chamber at the same level as the RF coil. This permits the power leads in the form of a coaxial cable between the tank circuit and the RF coil to be as short as possible.

The minimum height for conventional zone refining apparatus is at least for and often five times the length of the polycrystalline rod to be refined. The induction heating chamber itself must be twice as long as the rod to accommodate the full movememt of the rod through the RF coil. The fully extended positions of the rod holder and the seed holder are each equal to the length of the rod at a minimum.

Since the start-up time of a zone refining operation is very time consuming and requires monitoring by a highly skilled operator, a determined effort has been made to process larger and larger rods. Unfortunately, the overall height requirements for the zone refining apparatus poses a serious problem. In some cases, the size of the building housing the apparatus would have to be increased, an expense which may not be justifiable. Moreover, tall structures become laterally unstable, thereby posing serious problems of support and dimensional stability.

One possible solution is to move the RF induction heating coil rather than the semiconductor rod. If this solution were done then, in theory at least, the induction heating chamber could be made somewhat longer than the rod to be refined. The chamber would have to be longer than the rod to allow the starting position of the RF coil to be within view of the operator, to accommodate the rod holder and seed holder, and for any additional travel space required for the refining process. While this solution is at first appealing, it must be remembered that in order to melt larger diameter semiconductor rods, substantially high power at a very high frequency (from 2 to 4 megahertz) must be coupled into the rod by the induction heating coil. This means that if the RF coil is moved, a heavy flexible coaxial cable, or some other applicable means, must be used to connect the tank circuit to the RF coil. The expense and other problems, especially large power losses and possible arcing in the coaxial cable, make this approach to the problem very unattractive. Even under the best of circumstances, the cables needed to carry the power required to the RF coil will ordinarily result in a loss of 30 to 50 percent of the power; these numbers could vary depending upon the electrical circuits and machine design.

According to the present invention, the zone refining apparatus is provided with an induction heating chamber the longitudinal dimension of which is not determined by the length of the rod to be refined, but instead is limited only by considerations of space for the RF coil and related apparatus which must be mounted within the chamber, viewing space for the operator, and the heating effect on the structure above and below the chamber. More specifically, the semiconductor rod is moved and the RF coil is stationary, just as in the conventional apparatus. However, the semiconductor rod extends above the induction heating chamber initially and below the chamber at the conclusion of the refining process. An upper metal bellows extends from the top of the rod holder to the top of the chamber. A similar lower metal bellows extends from the bottom of the seed holder to the bottom of the chamber. The two bellows thus keep the working space both gas and vacuum tight. A telescoping group of steel cylinders are placed inside the lower bellows to protect the lower bellows from any molen semiconductor which may drop from the melt zone. The length of the telescoping cylinders collapsed is the same as the length of the bellows collapsed. Each bellows terminates in a flange that is bolted to the induction heating chamber. These bolts are easily undone for insertion and removal of the semiconductor rod.

In addition, the present invention incorporates the application of non-wearing magnetic fluid seals to be used with the top and bottom shafts, i.e., the semiconductor rod and the seed holder. Non-wearing magnetic fluid seals are used only as rotary seals, thus such seals are not suitable for conventional zone refiners where the shafts have linear as well as rotational displacements with respect to the seals. In refiners using bellows, the shaft seal assembly and the shaft move up and down with zero relative linear motion. The motion of the shaft is attained by collapsing and opening the bellows; thus the relative motion of the shaft with the seal is purely rotational.

Commonly used seals in conventional refiners are either O-ring type or carbon impregnated spring loaded teflon seals. In an O-ring type shaft seal system, too much of torque is exerted on the shaft which may result in a jerky operation, and may even produce chattering or vibration during the crystal growth process. For obtaining high vacuum with these seals, it is desired that a monolayer of vacuum grease be used with the O-rings. Any kind of grease used eventually ends up in the zone refiner chamber and at times becomes as a contaminant. Another disadvantage is when the small silicon chips cut through the O-ring surfaces making them less effective for good sealing. Spring loaded teflon have similar problems. Potential problems are encountered when the machine is switched from vacuum refining to gas refining. This is because of different design criteria of these seals under both applications.

On the other hand, magnetic seals are excellent for vacuum as well as for positive pressure conditions, and do not require any modifications in switching from one mode to another. They do not exert any torque on the shafts because there is no radial and peripherial forces involved. The sealing is done by the magnetic fluid which does not apply pressure. Since the fluid stays at the same place and does not ride up and down on the shaft, there is no contamination involved. Even in the case when small silicon chips get in the fluid its effectiveness is not reduced significantly.

To load the apparatus according to the invention, the upper bellows is extended fully to place the rod holder at its upper most position above the induction heating chamber. The upper bellows is then unbolted from the chamber and compressed from the bottom up thereby permitting the semiconductor rod to be fastened to the rod holder with the lower or free end of the semiconductor rod just projecting within the heating chamber. The upper bellows is then extended and re-attached to the top of the chamber. In a similar operation, the semiconductor seed crystal is attached to the seed holder. Once the lower bellows is attached to the bottom of the induction heating chamber, the lower bellows is compressed upward so that the seed crystal is in position to begin the zone refining process. During the zone refining process, the rod holder and seed holder move downwardly causing the upper bellows to compress and the lower bellows to expand. At the end of the refining process, the bottom bellows is unbolted from the bottom of the heating chamber and compressed downwardly permitting easy access to the refined monocrystalline semiconductor rod which is removed from the seed holder.

BRIEF DESCRIPTION OF THE DRAWINGS

The invention will be better understood from the following detailed description taken together with reference to the drawings, in which:

FIG. 6 is a fragmentary cross-sectional view of the rod holder base and gas light magnetic fluid seal means for the rod positioned between the chamber and rod rotation drive.

FIG. 7 is a fragmentary cross-sectional view of the gas light magnetic fluid seal means for the rod or seed holder shaft.

DESCRIPTION OF THE PREFERRED EMBODIMENT

Figure 1:
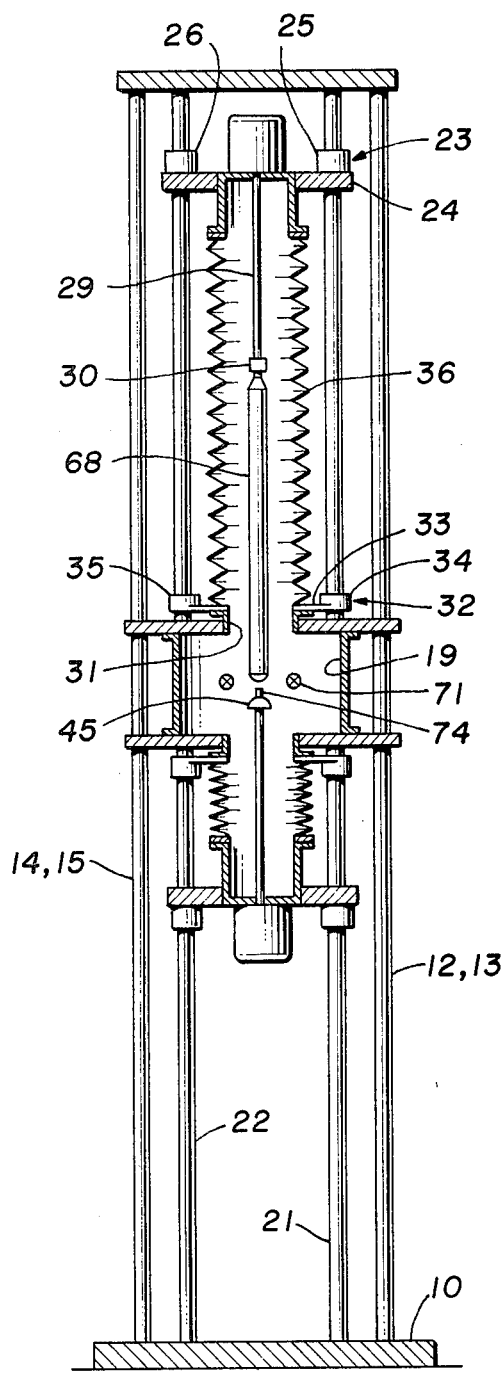
FIG. 1 is a cross-sectional view of the apparatus according to the invention showing the upper bellows fully expanded and the lower bellows fully compressed at the beginning of the refining process.
Figure 3:
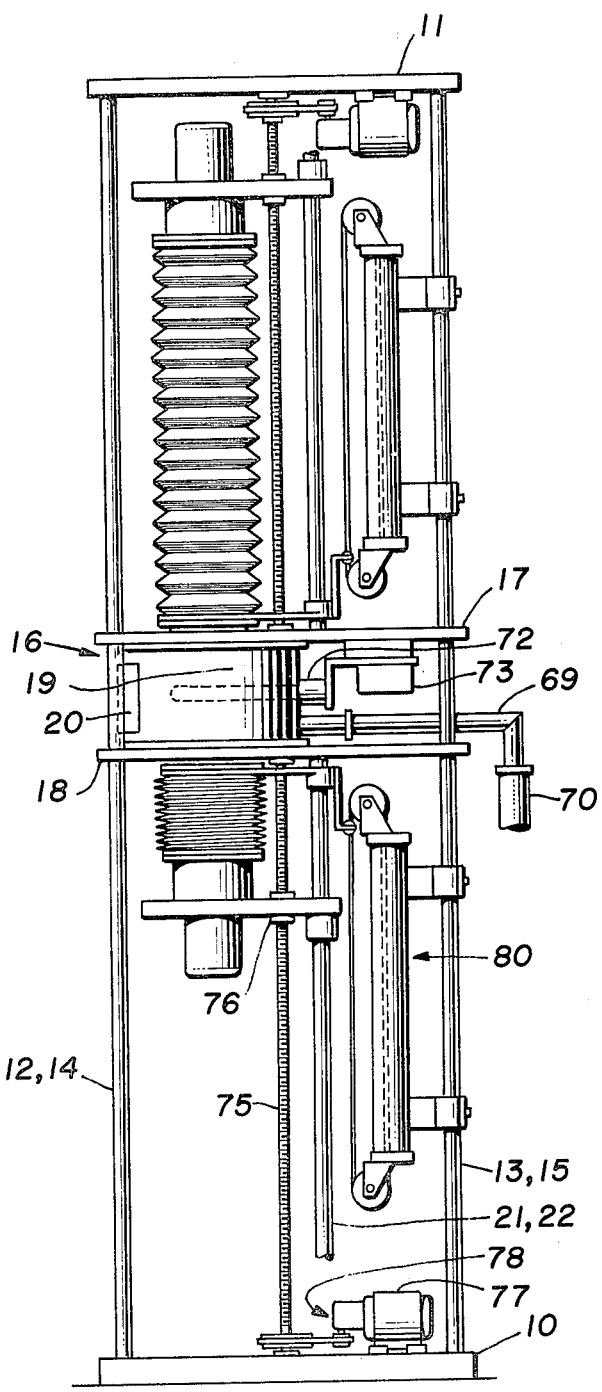
FIG. 3 is a side view of the apparatus according to the invention showing in more detail the traversing mechanisms.

Referring now to the drawings wherein the same reference numerals refer to identical or corresponding parts throughout the several views, the frame for the apparatus comprises a base plate 10, a top plate 11 and four supporting rods 12, 13, 14, and 15 as shown; for example, in FIGS. 1 and 3 of the drawings. An induction heating chamber 16 is fixedly attached to the supporting rods approximately midway between the base plate 10 and the top plate 11. The induction heating chamber 16 is defined by a top 17 having an opening therein, a bottom 18 having an opening therein, and a side wall 19. The top 17 and bottom 18 are substantially identical being generally rectangular in shape and fixedly attached to the supporting rods 12, 13, 14, and 15. The spacing between the top 17 and the bottom 18 is relatively close being determined by mechanical considerations which are discussed in more detail hereinafter. The side wall 19 is generally cylindrical in shape having outwardly projecting flanges at either end. These flanges are attached to the top 17 and the bottom 18 to form a gas tight seal therebetween. This may be done by welding, bolting with a gasket or any other conventional means. At what may be considered the front of the apparatus, the side wall 19 is provided with a transparent window 20 to permit the operator to observe the zone refining process.

Two guide rods 21 and 22 are journaled into the base plate 10 and the top plate 11. Alternatively, each guide rod 21 and 22 may be divided such that guide rods 21a and 22a are journaled into the base plate 10 and the bottom 18 of the induction heating chamber 16 while guide rods 21b and 22b are journaled into the top plate 11 and the top 17 of the induction heating chamber 16. A rod holder carriage assembly 23 is slidably mounted on the guide rods 21 and 22. The carriage assembly 23 comprises a carriage plate 24 having journaled bearings 25 and 26 through which the guide rods 21 and 22 pass. A cup-shaped member 27 opening downwardly and having an outwardly projecting flange is mounted within an opening formed in the carriage base 24 so that the closed end of the cup-shaped member 27 is flush with the top surface of the carriage plate 24. An electric motor 28 is centrally mounted on the upper exterior surface of the cup-shaped member 27. The rotating shaft of the electric motor 28 projects into the cup-shaped member 27 and has attached thereto a rod holder 29. The cup-shaped member 27 and the electric motor 28 are sealed so as to form a gas tight structure. The rod holder 29 is provided at its lower most end with a suitable appliance 30 for gripping or holding a semiconductor rod which is to be refined.

The opening in the top plate 17 of the induction heating chamber 16 is provided with a short cylindrical fitting 31 having an outside diameter equal to the inside diameter of the opening in the top 17. This fitting 31 is fixedly attached to the internal surface of the opening in top 17 as by welding, bolting or the like to provide a gas tight seal. The fitting 31 projects upwardly beyond the induction heating chamber and is provided with an outwardly projecting flange. This flange mates with a bellows carriage assembly 32 which comprises a carriage plate 33 and journaled bearings 34 and 35 through which the guide rods 21 and 22 pass. The carriage plate 33 is bolted to the flange of the fitting 31, and a gas tight seal is provided by a compressed O-ring. A metallic bellows 36 is connected at its lower end to the bellows carriage plate 33 and at its upper end to an annulus 37 which mates with the outwardly projecting flange of the cup-shaped member 27. The annulus 37 may be permanently attached to the outwardly projecting flange of the cup-shaped member 27 by welding, but preferably the annulus 37 and the outwardly projecting flange of the cup-shaped member 27 are bolted together with a gas tight seal such as a compressed O-ring so that the bellows 36 may be removed and replaced if required.

A similar structure is provided in the bottom portion of the apparatus. More particularly, a seed holder carriage assembly 38 is slidably mounted on the guide rods 21 and 22. The seed holder carriage assembly 38 comprises a carriage plate 39 having journaled bearings 40 and 41 through which the guide rods 21 and 22 pass. A cup-shaped member 42 is mounted within an opening in the carriage plate 39 so that it opens upwardly. The cup-shape member 42 is provided with an outwardly projecting flange and is mounted within the opening in the carriage plate 39 so that the closed end of the cup-shape member 42 is flush with the lower surface of the carriage plate 39. An electric motor 43 is mounted on the exterior surface of the closed end of the cup-shape member 42, and the rotating shaft of the electric motor 43 projects into the cup-shape member 42. Again, the cup-shape member 42 and the electric motor 43 are sealed to provide a gas tight structure. The rotating shaft of the electric motor 43 has a seed holder 44 attached to it. The seed holder 44 projects upwardly and is provided at its upper most end with an appliance 45 for mounting a semiconductor seed crystal.

The opening in the bottom 18 of the induction heating chamber 16 is provided with a cylindrical fitting 46 which has an outside diameter equal to the inside diameter of the opening in the bottom 18. The fitting 46 is welded, bolted or the like to the inside surface of the opening in the bottom 18 to form a gas tight seal. The fitting 46 projects downwardly outside of the induction heating chamber 16 and has an outwardly projecting flange. This flange mates with a lower bellows carriage assembly 47 which comprises a carriage plate 48 and journaled bearings 49 and 50 through which the guide rods 21 and 22 pass. The carriage plate 48 is bolted to the outwardly projecting flange of the fitting 46, and a gas tight seal is provided by a compressed O-ring. One end of the bellows 51 is attached to the carriage plate 48, while the other end of the bellows 51 is attached to an annulus 52. The annulus 52 is bolted to the outwardly projecting flange of the cup-shaped member 42, and a gas tight seal is provided by a compressed O-ring.

In order to load a polycrystalline semiconductor rod to be refined, the rod holder carriage assembly 23 is raised to its highest point along the guide rod 21 and 22. This is accomplished with the traversing mechanism shown in FIGS. 3 and 4. More specifically, a lead screw 53 is rotatably journaled at one end in the top plate 11 and at the other end in the top 17 of the induction heating chamber 16. The screw 53 passes through but does not engage the carriage plate 33 of the bellows carriage assembly 32. However, the carriage plate 24 of the rod holder carriage assembly 23 is provided with a screw follower 54 through which the screw 53 passes. The upper end of the screw 53 is provided with a pulley 55. The pulley 55 is rotated and the screw 33 is in turn rotated by a belt 56 which passes around a driving pulley 57. The driving pulley 57 is mounted on a shaft projecting out of the gear transmission 58. The gear transmission 58 is in turn driven by an electric motor 59 mounted to the top plate 11.

Once the rod holder carriage assembly 23 has been moved to its upper most position, the bellows carriage plate 33 can be unbolted from the flange of the fitting 31 and the bellows 36 collapsed to expose the rod holder 29. To accomplish this, there is provided a hydraulic motor 60 attached to the support rods 13 and 15. The hydraulic motor 60 is centrally located between the support rods 13 and 15 and more importantly it is centrally located between the guide rods 21 and 22. As illustrated, the hydraulic motor 60 is a linear motor of conventional design having a cylindrical housing 61 having a movable piston (not shown) housed therein. The piston moves upwardly or downwardly within the housing 61 under control of a pneumatic or fluid source in a well-known manner. The ends of the cylindrical housing 61 are sealed with end caps 62 and 63. These end caps support pulleys 64 and 65. A cable 66 attached at either end to the piston within the cylindrical housing 61 passes through seals in the end caps 62 and 63 and around the pulleys 64 and 65. A traverse fitting 67 is attached on the one hand to the cable 66 and on the other hand to the bellows carriage assembly 32. Thus, as the piston in the cylindrical housing 61 moves downwardly, the cable 66 moves in a clockwise direction causing the bellows 36 to be collapsed.

Figure 4:
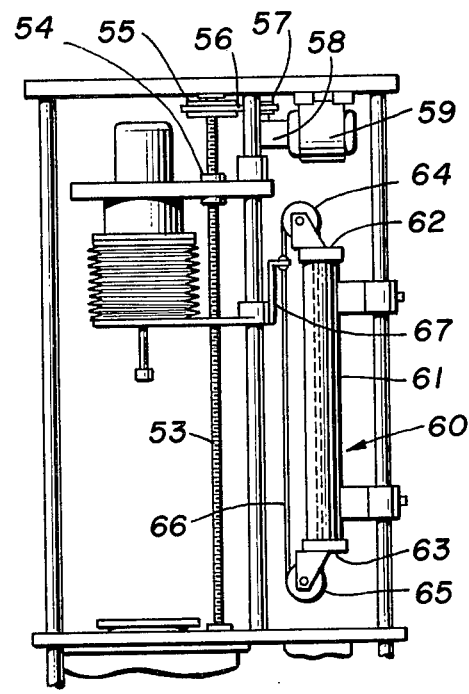
FIG. 4 is a fragmentary side view of the upper portion of the apparatus illustrating the position of the upper bellows to permit loading a semiconductor rod to be refined.

With the rod holder carriage assembly 23 and bellows 36 in the position illustrated in FIG. 4, a polycrystalline semiconductor rod to be refined can be loaded into the apparatus. This is done by attaching one end of the rod 68 in the appliance 30 at the end of the rod holder 29 so that the free end of the rod projects just into the induction heating chamber 16 as illustrated in FIG. 1. Once the rod 68 has been attached to the rod holder 29 by means of the appliance 30, the bellows 36 can be once again expanded by operating the hydraulic motor 60 so that the bellows carriage plate 33 can be bolted to the outwardly projecting flange of the fitting 31. In a similar manner, the seed crystal 74 is mounted within the appliance 45 at the end of the seed holder 44. A linear hydraulic motor 80 collapses the bellows 51 and the seed crystal is easily mounted. The bellows 51 can once again be expanded by operating the hydraulic motor 80 so that the bellows carriage plate 48 can be bolted to the outwardly projecting flange of the fitting 46. Once a gas tight seal has been made, the volume within the induction heating chamber 16 and the bellows 36 and 51 is purged with an inert gas, such as argon, for gas refining or evacuated for vacuum refining. For gas refining, the volume within the chamber 16 and the bellows 36 and 51 is filled with an inert gas such as argon. To accomplish this, there is illustrated in FIG. 3 a conduit 69 which communicates with the interior of the induction heating chamber 16 at one end thereof and is attached at the other end thereof to a vacuum pump 70. It will, of course, be understood that other conduits and valving mechanisms to the induction heating chamber 16 could be provided as may be required, but these are not shown in the drawings in order to simplify the illustration of the overall apparatus.

Within the induction heating chamber 16 is an RF induction coil 71 of suitable design. This induction heating coil 71 is centrally located within the chamber 16 and axially aligned with the rod holder 29 and the seed holder 44. The RF induction heating coil 71 is connected by means of an electrical fitting 72 which projects into the induction heating chamber 16 to a tank circuit which is enclosed in the housing 73. The housing 73 is mounted to but electrically insulated from the bottom surface of the top 17 of the induction heating chamber 16

At the beginning of the refining process, the rod holder carriage assembly 23 is moved downwardly so that the free end of the rod 68 is proximate to the RF heating coil 71. The coil 71 inductively heats and melts the free end of the rod to form a molten droplet. The operator observes this through the window 20 of the chamber 16 and causes the seed holder carriage assembly 38 to be moved upwardly so that a seed crystal 74 mounted in the appliance 45 at the end of the seed holder 44 fuses to the molten droplet at the end of the rod 68.

The mechanism for moving the seed holder carriage assembly 38 is identical with the mechanism for moving the rod holder carriage assembly 23 and is illustrated in FIG. 3 as comprising a lead screw 75 passing through a screw follower 76 in the carriage plate 39. The lead screw 75 is driven by an electric motor 77 mounted on the base plate 10 through a belt and gear transmission 78.

Figure 2:
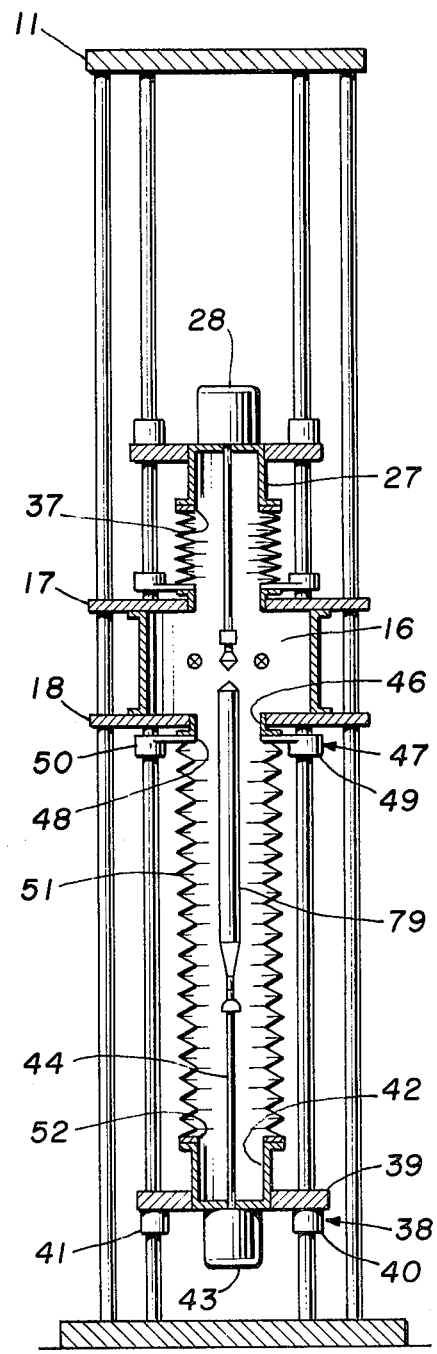
FIG. 2 is a cross-sectional view of the apparatus according to the invention showing the upper bellows fully compressed and the lower bellows fully expanded at the end of the refining process.

Once the seed crystal 74 has fused in the molten drop at the end of the rod 68, then both the rod holder carriage assembly 23 and the seed holder carriage assembly 38 are progressively moved downwardly so that the rod 68 passes downwardly through the RF induction heating coil, and as a result the melt zone moves upwardly along the length of the rod 68. The rod holder carriage assembly 23 and the seed holder carriage assembly 39 can be moved at different rates or the same rate, and the rod holder 29 and the seed holder 44 can be rotated by the electric motors 28 and 43 respectively. When either the rod holder carriage assembly or the seed holder carriage assembly has reached its lower most point, as illustrated in FIG. 2, the refining process is completed. After allowing sufficient time for cooling the now refined monocrystalline, semiconductor rod 79 can be moved from the apparatus. In order to accomplish this, the lower bellows carriage plate 48 is unbolted from the flange of the fitting 47, and the bellows 51 is collapsed. A linear hydraulic motor 80 similar to hydraulic motor 60 is provided for the purpose of collapsing and expanding the bellows 51 when the seed holder carriage assembly 39 is in its lower most position. Thus, the bellows 51 is collapsed in the same manner that bellows 36 is collapsed in the illustration shown in FIG. 4. With the bellows 51 collapsed, the refined monocrystalline semiconductor rod 79 can be easily removed from the apparatus.

As will now be fully appreciated, the longitudinal dimension of the induction heating chamber 16 is completely independent of the length of the semiconductor rod to be processed. Instead of having a longitudinal dimension which is twice the length of the rod to be processed as in conventional apparatuses of this type, the induction heating chamber 16 can be reduced in longitudinal dimension to a practical absolute minimum dimension thereby greatly decreasing the overall height of the zone refining apparatus while at the same time maintaining a stationary RF induction heating coil position. The limiting conditions for the longitudinal dimension of the induction heating chamber 16 are considerations of the space for the RF coil 71 and related apparatus which must be mounted within the induction heating chamber, the viewing space for the operator as provided by the window 20, and the heating effect on the bellows 36 and 51 above and below the chamber 16. In order to withstand the substantial temperatures generated in the zone refining apparatus, the bellows 36 and 51 are preferably made of metal. Although made of metal, the bellows are necessarily made of a light gauge metal in order to assure the required flexibility and, therefore, the lower bellows 51 is susceptible to damage from molten semiconductor that may drop from the melt zone. Additional protection from the substantial temperatures may be provided for the apparatus by water cooling the wall 19 of the induction heating chamber 16.

Figure 5:
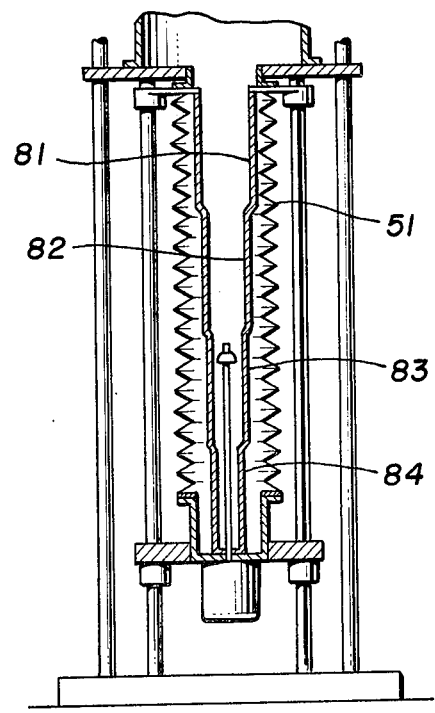
FIG. 5 is a fragmentary cross-sectional view of the lower portion of the apparatus showing the protective telescoping cylinders within the lower bellows.

Reference is now made to FIG. 5 of the drawings which shows a modification of the basic invention which provides protection for the lower bellows 51. More specifically, a plurality of telescoping steel cylinders 81, 82, 83, and 84 are coaxially located within the bellows 51. These steel cylinders are loose fitting and provided with mating inwardly and outwardly directed flanges. The largest cylinder 81 is attached in common with the bellows 51 at its upper end to the bellows carriage plate 48. The cylinders 82, 83, and 84 have progressively smaller diameters with the smallest cylinder 84 being attached at its lower end about the base of the seed holder 44 to the interior surface of the cup-shaped member 42. Thus, it will be appreciated that any molten semiconductor dropping from the melt zone will fall harmlessly within the telescoping steel cylinders 81, 82, 83 and 84 wich provide complete protection to the interior of the bellows 51. While four steel cylinders have been illustrated, it will be understood by those skilled in the art that the number of telescoping cylinders will be determined by the dimensions of the bellows 51 in its collapsed and expanded conditions. In other words, when the bellows 51 is fully collapsed as illustrated in FIGS. 1 and 3, the cylinders 81, 82, 83, and 84 will be fully telescoped, and when the bellows 51 is fully expanded as illustrated in FIGS. 2 and 5, the cylinders 81, 82, 83, and 84 will be fully extended.

The magnetic fluid seal means as incorporated into the bellows refiner as shown in FIGS. 1 through 5 comprises a means of generating a series of high intensity magnetic fields which entrap magnetic liquid as a dynamic sealant. A preferred magnetic fluid is non-wearing fenofluidic materials; i.e., a colloidal suspension of magnetic particles in a carried liquid that uniquely lends itself to the fabrication of non-wearing, zero leakage, zero sticking due to friction, rotary seals.

Referring to FIGS. 6 and 7, the basic features of the magnetic fluid seal means 86 are shown as magnetic fluid chamber 88, ring magnet 90, bearings 92, sleeve bearing 94, and sleeve-rod pin 96 all contained in housing 98 having mounting flanges 100 and retaining members 102 incorporated in the mounting flanges 100 and non-magnetic seal housing 104. Other magentic fluid seal means, not shown in the drawings, are relative in that a magnetic circuit is completed by the shaft or a shaft sleeve. Holding rings are suitable when machined either into the shaft or surrounding blocks, thus holding the magnetic fluid which is in a magnetic field focus between the surfaces of the rotating and stationary surfaces.

As this invention may be utilized for vacuum refining processes wherein the refining chamber is evacuated as well as gas refining processes wherein the refining chamber is filled with an inert gas, it is to be understood that the wording "gas tight" is defined as being both gas tight and vacuum tight. Thus, a gas tight seal or bellows is both gas tight and vacuum tight.

Having described a preferred embodiment of the invention, it will be apparent to those skilled in the art that modifications and variations can be made in the practice of the invention as defined in the appended claims.

What is claimed is:

1. In an apparatus for zone refining polycrystalline semiconductor rods to produce monocrystalline semiconductor rods, said apparatus having an RF induction heating coil, a rod holder and a seed holder aligned vertically above and below said heating coil, said rod holder being adapted to hold one end of a polycrystalline semiconductor rod to be refined and said seed holder being adapted to hold a seed crystal of said semiconductor, means for moving said rod holder relative to said RF induction heating coil to bring the free end of the polycrystalline semiconductor rod into proximity with said RF induction heating coil to melt said free end, and means for moving said seed holder relative to said RF induction heating coil so that the seed crystal contacts and fuses with the molten free end of the polycrystalline rod, said rod holder and said seed holder thereafter being moved in the same direction relative to said RF induction heating coil so that the zone of the melt is moved along the length of the semiconductor rod, the improvement comprising:

an induction heating chamber having said RF inductive heating coil fixed therein, said induction heating chamber having a longitudinal dimension independent of the length of the polycrystalline semiconductor rod to be processed;

a first gas tight bellows surrounding said rod holder, one end of said bellows being attached to said induction heating chamber and the other end of said bellows being attached to the base of said rod holder, the base of said rod holder having a gas tight magnetic fluid seal means for the rod between the chamber and rod rotation drive means, said bellows expanding and collapsing with the relative movement of said rod holder and said RF induction heating coil;

a second gas tight bellows surrounding said seed holder, one end of said bellows being attached to said induction heating chamber and the other end of said bellows being attached to the base of said seed holder, the base of said seed holder having a gas tight magnetic fluid seal means for the seed holder between the chamber and seed holder rotation means, said bellows expanding and collapsing with the relative movement of said seed holder and said RF induction heating coil; and a plurality of telescoping metallic cylinders surrounding said seed holder, within said corresponding second gas tight bellows, the largest of the telescoping metallic cylinders being attached in common with said second bellows to said induction heating chamber and the smallest of the telescoping steel cylinders being attached to the base of said seed holder, said plurality of telescoping metallic cylinders serving to protect said second bellows from molten semiconductor at all times when zone refining is taking place.

2. The improved apparatus for zone refining polycrystalline semiconductor rods as recited in claim 1, wherein said one end of each of said first and said second gas tight bellows are each releasably attached to said induction heating chamber to facilitate mounting a polycrystalline semiconductor rod to be refined in said rod holder, mounting a seed crystal in said seed holder, and removing a refined monocrystalline rod from said seed holder.

3. The improved apparatus for zone refining polycrystalline semiconductor rods as recited in claim 2, further comprising:

first means attached to said one end of said first gas tight bellows for collapsing said bellows when said rod holder is displaced from said RF induction heating coil to permit mounting a polycrystalline semiconductor rod to be refined in said rod holder, said first means thereafter expanding said bellows to permit sealing attachment of said one end to said induction heating chamber, and second means attached to said one end of said second gas tight bellows for collapsing said bellows when said seedholder is displaced from said RF induction heating coil to permit removing a refined monocrystalline semiconductor rod from said seed holder and mounting a semiconductor seed crystal in said seed holder, said second means thereafter expanding said bellows to permit sealing attachment of said one end of said induction heating chamber.

4. The improved apparatus for zone refining polycrystalline semiconductor rods as recited in claim 1, wherein said induction heating chamber is stationary and includes means for evacuating said chamber and said first and second gas tight bellows after said first and second gas tight bellows are attached to said induction heating chamber.

5. The improved apparatus for zone refining polycrystalline semiconductor rods as recited in claim 4, wherein said induction heating chamber further includes means for filling said induction heating chamber and said first and second gas tight bellows with an inert gas.

6. In an apparatus for zone refining polycrystalline semiconductor rods to produce monocrystalline semiconductor rods, said apparatus having an RF induction heating coil, a rod holder and a seed holder aligned vertically above and below said heating coil, said rod holder being adapted to hold one end of a polycrystalline semiconductor rod to be refined and said seed holder being adapted to hold a seed crystal of said semiconductor, means for moving said rod holder relative to said RF induction heating coil to bring the free end of the polycrystalline semiconductor rod into proximity with said RF induction heating coil to melt said free end, and means for moving said seed holder relative to said RF induction heating coil so that the seed crystal contacts and fuses with the molten free end of the polycrystalline rod, said rod holder and said seed holder thereafter being moved in the same direction relative to said RF induction heating coil so that the zone of the melt is moved along the length of the semiconductor rod, the improvement comprising:

- a stationary induction heating chamber having said RF inductive heating coil fixed therein, said induction heating chamber having a longitudinal dimension independent of the length of the polycrystalline semiconductor rod to be processed,
- a first gas tight bellows surrounding said rod holder, one end of said bellows being releasably attached to said induction heating chamber to facilitate mounting a polycrystalline semiconductor rod to be refined in said holder and the other end of said bellows being attached to the base of said rod holder, the base of said rod holder having a gas tight magnetic fluid seal means for the rod between the chamber and rod rotation drive means, said bellows expanding and collapsing with the relative movement of said rod holder and said RF induction heating coil, and
- a second gas tight bellows surrounding said seed holder, one end of said bellows being releasably attached to said induction heating chamber to facilitate mounting a seed crystal in said seed holder and removing a refined monocrystalline rod from said seed holder and the other end of said bellows being attached to the base of said seed holder, the base of said seed holder having a gas tight magnetic fluid seal means for the seed holder between the chamber and seed holder rotation means, said bellows expanding and collapsing with the relative movement of said seed holder and said RF induction heating coil,
- a plurality of telescoping metallic cylinders surrounding said seed holder, within said corresponding second gas tight bellows, the largest of the telescoping metallic cylinders being attached in common with said second bellows to said induction heating chamber and the smallest of the telescoping steel cylinders being attached to the base of said seed holder, said plurality of telescoping metallic cylinders serving to protect said second bellows from molten semiconductor at all times when zone refining is taking place, said first and second bellows further including:
- first means attached to said one end of said first gas tight bellows for collapsing said bellows when said rod holder is displaced from said RF induction heating coil to permit mounting a polycrystalline semiconductor rod to be refined in said rod holder, said first means thereafter expanding said bellows to permit sealing attachment of said one end to said induction heating chamber, and
- second means attached to said one end of said second gas tight bellows for collapsing said bellows when said seed holder is displaced from said RF induction heating coil to permit removing a refined monocrystalline semiconductor rod from said seed holder and mounting a semiconductor seed crystal in said seed holder, said second means thereafter expanding said bellows to permit sealing attachment of said one end of said induction heating chamber, wherein said induction heating chamber further includes:
- means for evacuating said chamber and said first and second gas tight bellows after said first and second gas tight bellows are attached to said induction heating chamber, and
- means for filling said induction heating chamber and said first and second gas tight bellows with an inert gas.

7. The improved apparatus of claim 6 wherein said induction heating chamber includes a water cooled wall.

* * * * *